(12) United States Patent
Tran

(10) Patent No.: US 9,250,281 B2
(45) Date of Patent: Feb. 2, 2016

(54) METHOD AND SYSTEM FOR REDUCING SELF-INTERFERENCE IN A HANDHELD COMMUNICATION DEVICE

(75) Inventor: Michael Tran, Mississauga (CA)

(73) Assignee: PISON INC., Mississauga, Ontario (CA)

(*) Notice: Subject to any disclaimer, the term of this patent is extended or adjusted under 35 U.S.C. 154(b) by 68 days.

(21) Appl. No.: 13/489,782

(22) Filed: Jun. 6, 2012

(65) Prior Publication Data

US 2013/0329380 A1 Dec. 12, 2013

(51) Int. Cl.
*H05K 7/02* (2006.01)
*G01R 31/28* (2006.01)
*G01R 31/00* (2006.01)

(52) U.S. Cl.
CPC .......... *G01R 31/002* (2013.01); *G01R 31/2801* (2013.01); *G01R 31/2822* (2013.01); *Y10T 29/49004* (2015.01)

(58) Field of Classification Search
CPC ............. H05K 9/00; H05K 7/02; G01R 31/28
USPC .......................... 361/816, 818; 438/14, 17–18
See application file for complete search history.

(56) References Cited

U.S. PATENT DOCUMENTS

| | | | |
|---|---|---|---|
| 6,525,657 B1* | 2/2003 | Wojcik | 340/514 |
| 7,928,825 B2* | 4/2011 | Yang | H01R 13/7137 337/68 |
| 7,928,925 B2* | 4/2011 | Zhu et al. | 343/841 |
| 7,928,952 B2* | 4/2011 | Akimoto et al. | 345/98 |
| 2003/0117787 A1* | 6/2003 | Nakauchi | 361/818 |
| 2009/0109200 A1* | 4/2009 | Lee et al. | 345/205 |
| 2009/0295405 A1* | 12/2009 | Pommerenke et al. | 324/627 |
| 2011/0004283 A1* | 1/2011 | Stevenson | H01G 4/40 607/116 |

* cited by examiner

*Primary Examiner* — Jenny L Wagner
*Assistant Examiner* — Michael P McFadden

(57) ABSTRACT

A method and a system for a handheld communication device is provided. The method includes: a testing a printed circuit board PCB assembly; identifying an emission point in the PCB; allocating a frequency radio (RF) absorber over or close to the emission point where the emission point is a potential source of electromagnetic interference (EMI) other than electronic components mounted on the PCB. The system includes a PCB assembly; and an RF absorber planar plate secured over or close to the emission point, for reducing the EMI from the emission point. A handheld communication device includes an antenna system and the PCB assembly with the RF absorber for isolating the antenna system from self-interference in the device.

19 Claims, 14 Drawing Sheets

METHOD AND SYSTEM FOR REDUCING SELF-INTERFERENCE IN A HANDHELD COMMUNICATION DEVICE

FIELD OF INVENTION

The present invention relates to handheld communication devices, and more specifically to a method and system for reducing self-interference in a handheld communication device.

BACKGROUND OF THE INVENTION

Handheld devices have been developed for a wide variety of applications, which include, for example, cell phones, personal digital assistants (PDAs), handheld computer terminals, scanners, and RFID readers/writers. Such handheld devices generally have a computer circuit on the main logic board (MLB), one or multiple radio systems for sharing data with other computers over the internet, cellular or proprietary networks, and interfaces for communicating with external devices, together with other components having user interfaces (e.g., displays, keyboards).

Since there is a demand to reduce the size of handheld devices, components tend to be placed closely together in the package of the handheld device. This increases the chances of electromagnetic energy emitted from one circuit getting into another and possibly causing performance degradation. This electromagnetic interference (EMI) includes radio frequency interference (RFI). The radio frequency interference that originates from a fast switching digital circuit will typically reach frequencies that are several decades above the lowest clock frequency of the other circuitry in the device. If the device contains a radio, there is a chance that part of the interference spectrum will land in the radio's operating band and will get picked up by its antenna subsystem; effectively desensitizing the radio.

One approach for suppressing self interference on the antenna system of the handheld device is to put a metal shield over all active circuits of the handheld device, the shield providing a physical and electrical barrier to the EMI; however, this can not be applied over the display and keyboard areas. Furthermore, if a circuit board (e.g., main logic board, or MLB) is longer than ¼ wavelength of the lowest radio frequency, the handheld device itself becomes a part of the antenna that may pick up EMI, and thus shielding is not effective unless the entire handheld device is covered by a shield.

SUMMARY OF THE INVENTION

It is an object of the invention to provide a method and system that obviates or mitigates at least one of the disadvantages of existing systems.

According to an aspect of the disclosure, there is provided a method of reducing self-interference in a handheld communication device with a radio system, which includes: testing a printed circuit board (PCB) assembly having a PCB and device components mounted on the PCB for operation of the handheld communication device, the device components switching states or oscillating in the operation of the handheld communication device; analyzing a result at the step of testing; identifying an emission point in the PCB that is a potential source of electromagnetic interference (EMI) other than the device components; allocating a frequency radio (RF) absorber over, or close to, the emission point to inhibit the EMI otherwise emitted from the emission point.

According to another aspect of the disclosure, there is provided a system for a handheld communication device with a radio system, which includes: a printed circuit board (PCB) assembly having a PCB and device components mounted on the PCB for operation of the handheld communication device, the device components switching states or oscillating in the operation of the handheld communication device, the PCB assembly having an emission point, the emission point being a discontinuity of a structure or material of the PCB where the ground plane of the PCB radiates and being a potential source of electromagnetic interference (EMI) other than the device components; and a radio frequency (RF) absorber secured over or close to the emission point by adhesive, for reducing the EMI from the emission point.

According to a further aspect of the disclosure, there is provided a handheld communication device, which includes: a radio system, a printed circuit board (PCB) assembly having a PCB and device components mounted on the PCB for operation of the handheld communication device, the device components switching states or oscillating in the operation of the handheld communication device, the PCB being operatively coupling to the radio system when the PCB assembly and the radio system are installed in the handheld communication device, the PCB assembly having an emission point, the emission point being a discontinuity of a structure or material of the PCB where the ground plane of the PCB radiates and being a potential source of electromagnetic interference (EMI) other than the device components; and a radio frequency (RF) absorber secured over or close to the emission point by adhesive, for reducing the EMI from the emission point.

BRIEF DESCRIPTION OF THE DRAWINGS

These and other features of the invention will become more apparent from the following description in which reference is made to the appended drawings wherein.

DETAILED DESCRIPTION

One or more currently preferred embodiments have been described by way of example. It will be apparent to persons skilled in the art that a number of variations and modifications can be made without departing from the scope of the invention as defined in the claims.

Embodiments of the present invention are described using a handheld communication device having a radio system, one or more printed circuit boards (PCBs) and device components mounted on and/or coupled to the PCBs. The handheld communication device may be, for example, but not limited to, a cellar phone, a personal digital assistant (PDA), an image capture device, a barcode reader, a scanner, an RFID reader and/or writer, or a portable device enclosing one or more foregoing devices.

In the description, the term EMI (electromagnetic interference) is used to describe the radiated electromagnetic wave from a circuit that could interfere on the operation of other circuits. The term RFI (radio frequency interference) is used to describe loosely the high end spectrum of EMI that covers the operating frequency range of the radio system. The term "noise" is used to describe all signals that are not a desired radio signal. Thus to a radio, noise encompasses everything other than the desired signal from another radio that it is in communication with.

Figure 1:
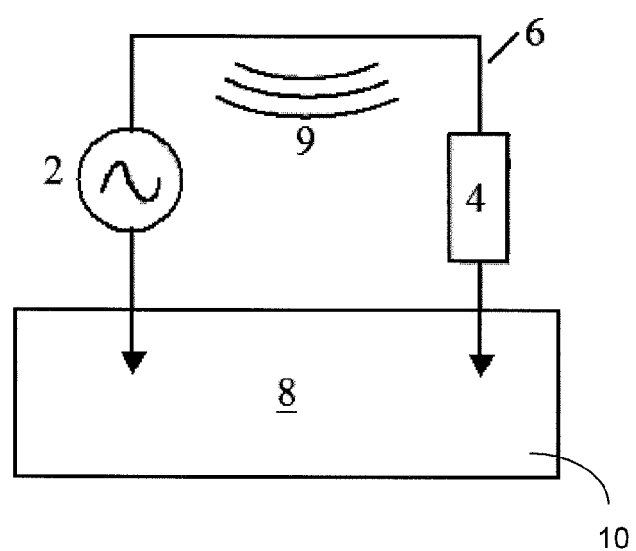
FIG. 1 is a schematic diagram illustrating EMI radiation in a handheld device having a printed circuit board (PCB)

Referring to FIG. 1, there is schematically illustrated a PCB's ground plane 8 coupling to one or more than one noise source 2 and one or more than one load 4 in a handheld communication device. The noise source 2, the load 4 and the PCB are mounted in the handheld communication device that includes a radio system having an antenna (not shown in FIG. 1). In FIG. 1, one noise source 2 and one load 4 are shown for illustration purposes only. In the description, the term "noise source" refers to any circuit that switches states or oscillates. The noise sources 2 generate a range of frequencies that they were intended to do, but in the process these frequencies will invariably radiate away from the circuit that generates. The cumulative effect of all of these switching circuits appears like noise on a spectrum analyzer. The energy radiated is usually coined by the term "EMI" or "RFI" interchangeably here because it is undesirable interference (there are applications where this is a desired behavior) but in this application it can only degrade the radio system performance. It is noted that not all self-generated EMI will affect radio performance. The amount of degradation depends on the frequency spectrum of the particular noise source as the radio is more vulnerable to certain frequency range and its magnitude relative to the lowest desired signal that the radio can receive. The noise source 2 is an active device component mounted on the PCB which includes PCB ground plane 8. The load 4 is a component other than the active device component and may be, for example, an input of an integrated circuit, a discrete component, or an unterminated line. In FIG. 1, the load 4 and the PCB ground plane 8 are illustrated separately. However, at least a part of the load 4 and the PCB ground plane 8 may overlap each other.

The noise source 2 and the load 4 are electrically or electromagnetically coupled to a trace 6 (e.g., a PCB trace of conductive material on a surface of the PCB) and the PCB ground plane 8. Trace 6 inherently forms an antenna structure with the PCB ground plane 8, with the trace 6 forming the radiator and the PCB ground plane 8 forming the counterpoise. The antenna is complete and EMI 9 radiates from the trace 6 and the PCB ground plane 8. Since this is not an intentional radiator, the efficiency of this antenna will be very poor; however there is a chance that certain frequency components of the noise source 2 will resonate with the geometry of the trace 6 and EMI 9 is generated. This may cause undesired coupling from the PCB to the radio system in the handheld communication device.

There is an emission point 10 (or a "hot spot") which is different from the noise sources 2 and still causes EMI. In FIG. 1, one emission point 10 is shown for illustration purposes only. The number of the emission point 10 may vary. To suppress EMI caused by the emission point 10, an absorber member is placed over or close to the emission point 10 such that it reduces or eliminates EMI radiated from the PCB ground plane 8. The absorber member may have a plate body, a sheet body or a cover.

Electromagnetic radiation occurs when there is a voltage differential, in the same manner that current flows when there is a voltage differential. The PCB ground plane 8 radiates just as much as the radiating element. Therefore conventional EMI suppression methods may be preferably still also applied to the noise sources 2.

The emission point 10 may be defined by a discontinuity (a break, an interruption) or a transition of a structure or material of the PCB ground plane 8 or any part of the PCB (e.g., top surface of the PCB), which, for example, includes edges of traces or edges of the PCB. The emission point 10 may be defined by a localized region of the PCB 10 in which there is a discontinuity or a transition of different types of materials in the PCB ground plane 8 or any part of the PCB. Another way to look at this is that the radiation point of an antenna is not necessarily the feed point, but it can be the extremities of the antenna.

In one example, the absorber member employed for the emission point 10 includes an RF absorber. Each RF absorber is sized to attenuate EMI from the corresponding emission point. "RF absorber" is the generic name for materials that have the capability to convert electromagnetic waves into heat, and they can do this efficiently; requiring a minimum amount of space inside the product. RF absorber is typically made from a non-conductive base material (such as foam, rubber, silicone, to name a few) which is impregnated with particles that excite when subjected to an electromagnetic wave, the energy from noise sources being converted to heat and dissipated. The active ingredient of RF absorber includes, for example, but is not limited to, at least one of a composition including ferrite, carbon, carbon fiber, alumina, sapphire, silica, titanium dioxide, iron, iron silicide and graphite. The actual selection of the RF absorber materials will be based upon the ability of the selected material or materials, to absorb RF over a desired frequency range. The RF absorption characteristic of many materials is well known or may be determined empirically, as needed. The RF absorber may be secured by chemical adhesives over or close to the emission points. In the drawings, the emission points and the RF absorbers for reducing EMI from the emission points are illustrated schematically only, and thus their sizes and shapes are not limited to those shown in the drawings and may vary.

Figure 2:
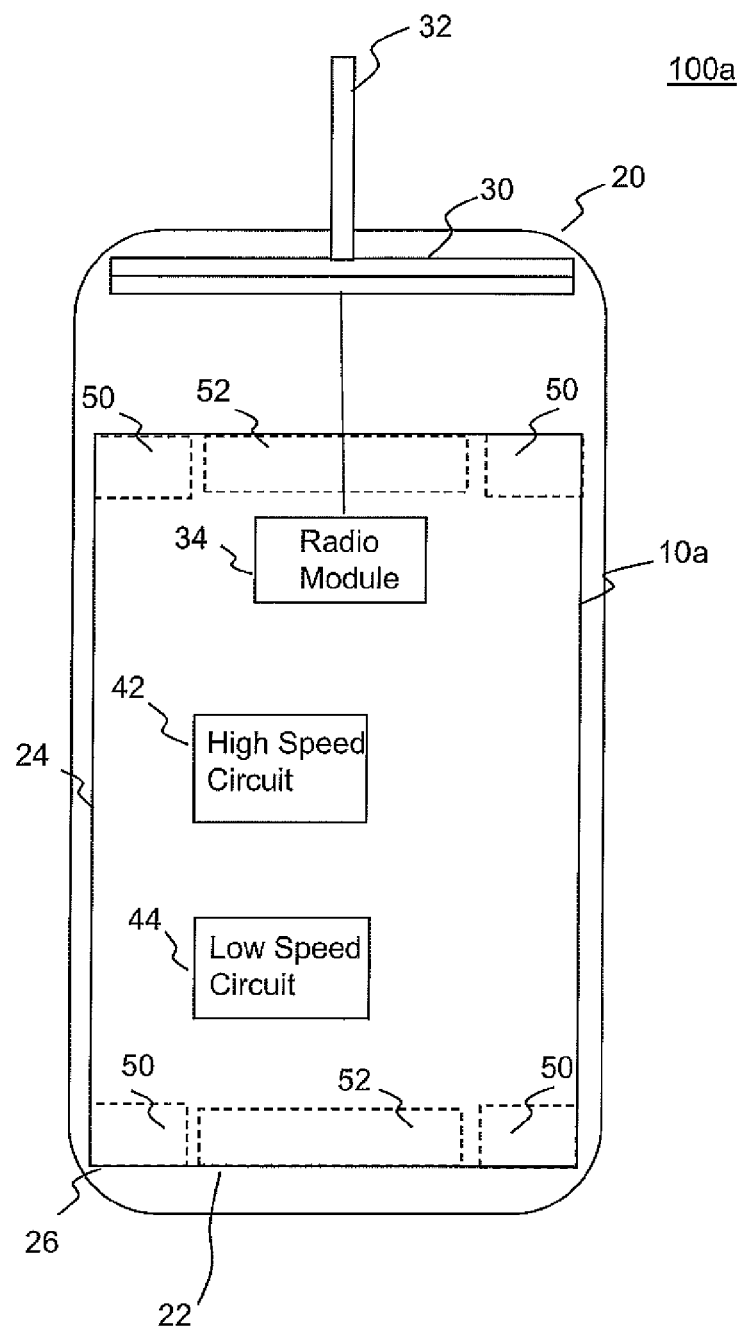
FIG. 2 is a schematic diagram illustrating an example of a handheld communication device with RF absorbers.
Figure 3:
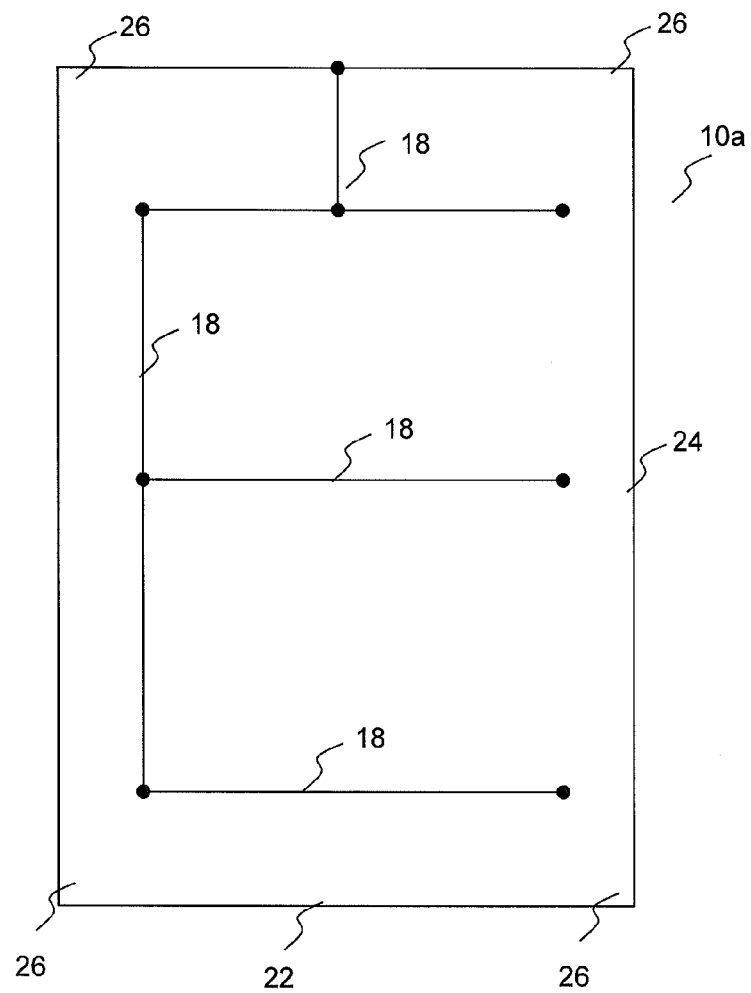
FIG. 3 is a schematic diagram illustrating an example of a PCB in the handheld communication device shown in FIG. 2.

Referring to FIGS. 2-3, an example of a handheld communication device 100a having a PCB assembly is described. In the drawings, the handheld communication device 100a and the PCB assembly with a PCB 10a are illustrated schematically. The size and the shape of components of the handheld communication device 100a and the PCB 10a may not be limited to those shown in the drawings and may vary. The handheld communication device 100a may contain more than one circuit board, and may contain other components not shown in the drawings.

The PCB assembly includes the PCB 10a and device components mounted on the PCB 10a. The device components may include a processor or CPU that may run at 400 MHz (G1) or 520 MHz (G2), a display and/or a memory that may operate around at 200 MHz, or other electronic components. The PCB 10a mechanically supports and electrically connects the device components of the handheld communication device 100a. A housing 20 defines an internal region of the handheld communication device 100a, for accommodating the PCB assembly.

In one example, the PCB 10a is a main logic board having a processor and a memory for operating the handheld communication device 100a. In another example, the PCB 10a may be a display board, a daughter board or any other circuit board. The PCB 10a may be multiple-layer PCBs (e.g., the main logic board, a daughter board, and/or a display board).

The handheld communication device 100a has a radio system having an antenna ground plane 30, an antenna radiator 32 coupled to the antenna ground plane 30, and a radio module 34 coupled to the antenna ground plane 30. In this example, the radio module 34 is mounted on or electromagnetically coupled to the PCB 10a. The radio module 34 receives and transmits signals through the antenna 30. The antenna system covers multiple sub-bands, for example, 403-433 MHz, 419-451 MHz, 450-480 MHz, and 480-512 MHz. The ground plane of the PCB 10a may be used as part of the antenna ground plane.

In one example, the antenna radiator 32 and the ground plane 30 form a dipole antenna where the ground plane 30 may behave as the second half of the dipole antenna. The ground plane 30 may act as a refection point for the antenna. The antenna includes, for example, a helical whip with the dedicated ground plane and is tuned to mach the terminal. The length of the antenna radiator 32 may be about one quarter the wavelength of the center frequency of the operating band. A ferrite core may be added to the antenna cable to reduce pick up of interference. In another example, the antenna may be a planer antenna.

In this example, the PCB 10a has an elongated body. A top surface of the PCB 10a has short edges 22, elongated edges 24, and corners 26 at which edges 22 and 24 meet. In one example, the PCB 10a has a length longer than one quarter of a wavelength in a certain channel (e.g., 406 MHz) that is transmitted or received at the antenna. For example, the PCB 10a may be 22 cm long and the quarter wavelength of the lowest channel of the radio module 34 that is received by the antenna may be about 19 cm.

The PCB 10a has a substrate and a plurality of ground and power planes. The substrate is made of an electrically non-conductive material, such as plastic. The substrate has a generally planar surface surrounded by the edges 22 and 24. The ground plane serves as ground references for the device components on the PCB 10a. The power plane is a positive or negative electrical potential with respect to the ground plane and supplies the corresponding power to the device components on the PCB 10a.

The electronic device components (e.g., 42 and 44 of FIG. 2) mounted on the surface of the PCB 10a are coupled to the power and/or ground plane of the PCB 10a via traces 18. The traces 18 are formed on the substrate of the PCB 10a, for example, as shown in FIG. 3. The traces 18 include conductive elements that may be, for example, but not limited to, copper, so that current flows between the traces 18 and the device components. The trace 18 may be formed by bonding a layer of conductive material over the substrate and then removing the unwanted section of the layer with a mask. The trace 18 may be formed by bonding conductive material to the substrate of the PCB 10a. The traces 18 may be in different configurations. It would be appreciated by one of ordinary skill in the art that the device components may be coupled to the traces 18 via leads (e.g., wires, contact points).

The device components that are mounted on the PCB 10a to form the PCB assembly may include, for example, but not limited to, one or more high speed electronic circuits 42 (e.g., a processor, a CPU, a memory, a clock) and one or more low speed electronic circuits 44 (e.g., a keyboard assembly, an audio assembly, lighting elements). The high speed electronic circuits 42 are high power and/or high frequency noise sources. The low speed electronic circuits 44 are low frequency and/or low power noise sources. The high speed electronic circuits 42 may become noise sources that affect the operation of the handheld communication device 100a. For example, interference to the narrow band (NB) frequency would occur when the CPU runs at 400 MHz (G1) or 520 MHz (G2), and other circuitries, such as a memory or a display, operating in the 200 MHz range. The high speed electronic circuits 42 are therefore treated with one or more conventional EMI suppression methods.

The edges 22, 24 and the corners 26 of the PCB 10a or the corresponding part of the PCB ground plane can be emission points that are sources of unwanted electromagnetic waves in the handheld communication device 100a, and the entire PCB 10a can act as an antenna for noisy digital circuits. The PCB 10a itself may act as a secondary/minor ground plane for the NB antenna when the edge of the PCB 10a is longer than (e.g., 4 cm longer than) the quarter wavelength of a certain channel (e.g., 406 MHz). The elongated PCB 10a would radiate electromagnetic waves mostly along the short edges 22 of the PCB 10a. Therefore, RF absorbers 50 and/or 52 are placed over or close to the edges 22 and/or the corners 26 of the top surface of the PCB 10a to suppress radiation of EMI from the emission points. The RF absorbers 50 and 52 may be placed as far toward the corners of the surface of the PCB 10a and the shorter edges 22 of the PCB 10a, depending on the design of the PCB 10a or device components on the PCB. RF absorbers may be placed over or close to other edges 24.

The RF absorbers for suppressing EMI from the emission points may not overlap the active electronic components or EMI shield. The RF absorber may be a ferrite loaded sheet of RF absorber. In a non-limiting example, the RF absorber is cut from a sheet of ferrite loaded dense foam with a certain thickness that corresponds to the desired attenuation performance. One surface is treated with an adhesive so that it can be applied directly on the top or close to the emission point or a localized region associating the emission point. The RF absorbers 50 and 52 do not fit around the side of the PCB 10a or bend from the top surface toward the side of the PCB 10a. The thicker the RF absorber, the more attenuation it provides. However physical limitation typically dictates the thickness used. The RF absorber used is, for example, but not limited to, 1.5 mm thick. Depending upon the RF absorbing material, or materials, employed and the frequency bands of the EMI to be absorbed, it is contemplated that RF absorbers in accordance with the embodiment of the present disclosure can range from thicknesses of from about 1 mm up to many cm thick. Given the same base material (such as foam) the thickness of an RF absorber is proportional to the amount of absorption offered. More particularly, it is contemplated that RF absorbers in accordance with the embodiment of the present disclosure can range from thicknesses of from about 1 mm to about 2 mm.

It would be appreciated by one of ordinary skill in the art that the sizes and the shapes of the RF absorbers 50 and 52 may not be limited to those shown in the drawings and may vary. More or few RF absorbers may be allocated than those depicted in the drawings.

Figure 4:
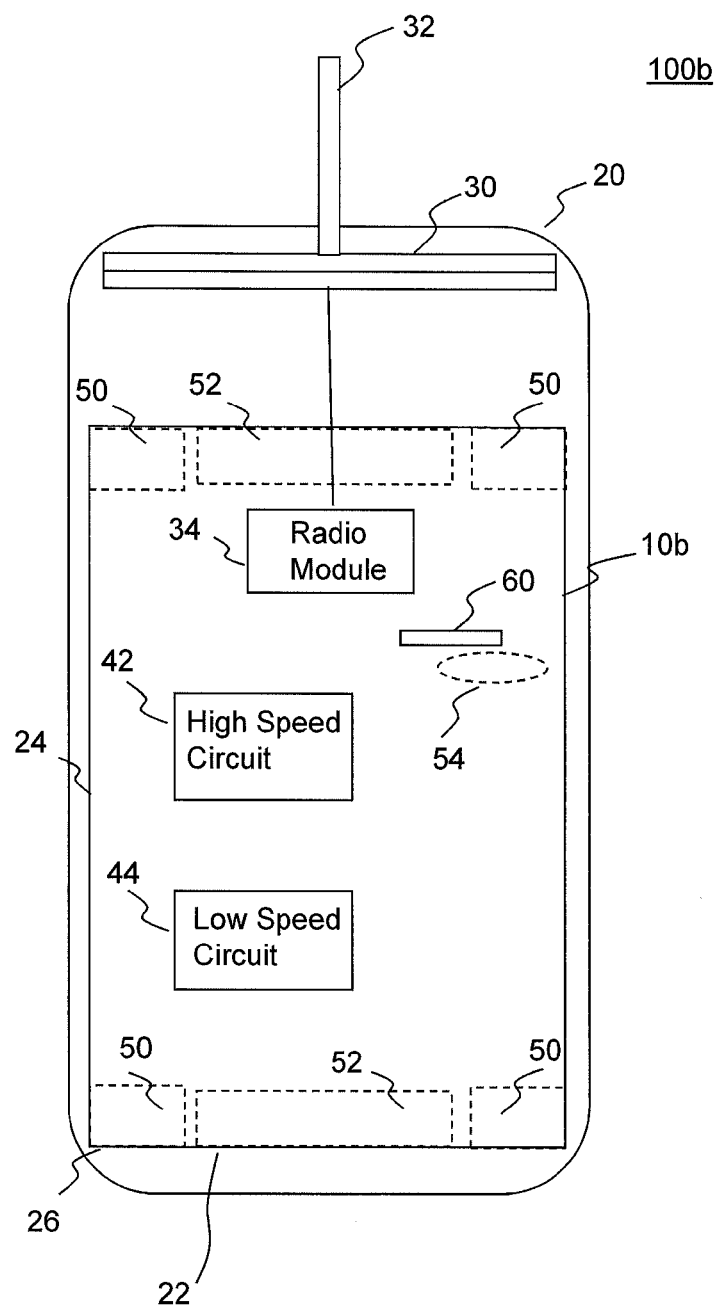
FIG. 4 is a schematic diagram illustrating a further example of a handheld communication device with RF absorbers.
Figure 5:
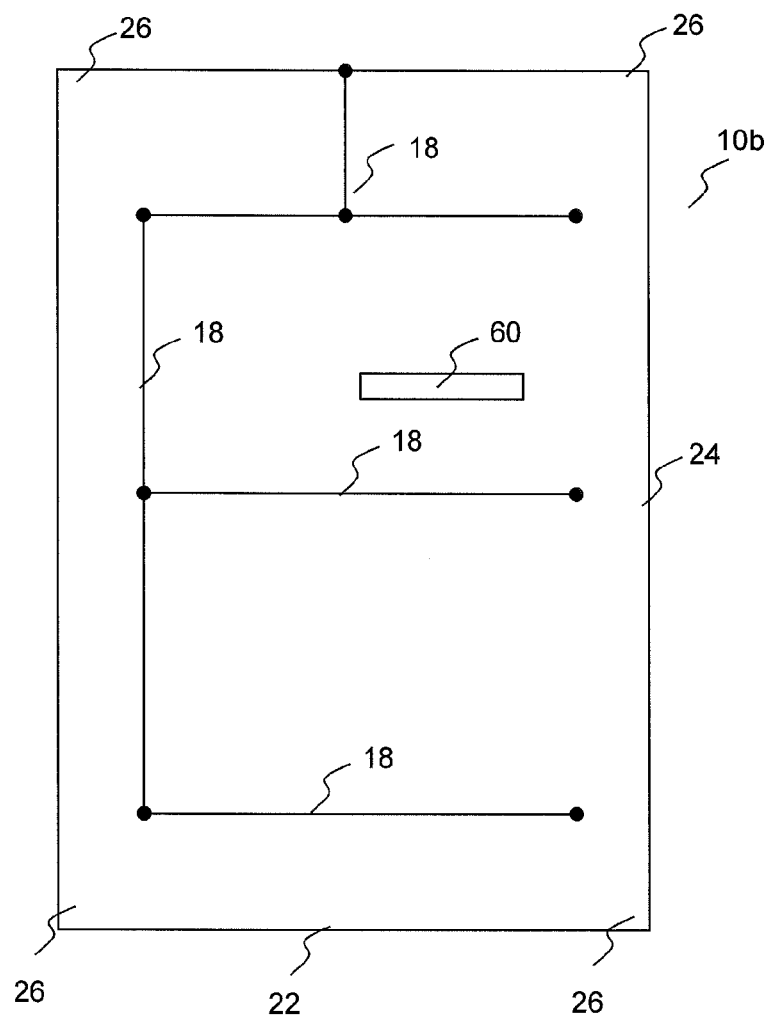
FIG. 5 is a schematic diagram illustrating an example of a PCB in the handheld communication device shown in FIG. 4.
Figure 6:
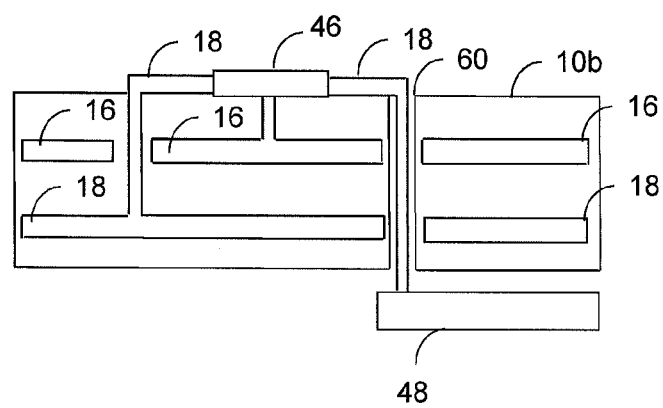
FIG. 6 is a schematic diagram illustrating a cross-sectional view of the PCB shown in FIG. 5.

Referring to FIGS. 4-6, a further example of a handheld communication device 100b having a PCB assembly is described. In the drawings, the handheld communication device 100b and the PCB assembly with a PCB 10b are illustrated schematically. The size and the shape of components of the handheld communication device 100b and the PCB 10b may not be limited to those shown in the drawings and may vary. The handheld communication device 100b may contain more than one circuit board, and may contain other components not shown in the drawings.

The PCB 10b includes one or more cut outs 60. The cut out 60 passes through the substrate and/or the ground plane of the PCB 10b. The cut out 60 is identified as an emission point causing electrical current converted to EM wave, similar to a slot in an antenna. Therefore RF absorber 54 is placed on the top surface of the PCB 10b and close to the cut out 60 to attenuate EMI caused by the cut out 60.

In one example, the cut out 60 may be formed to meet a certain design constraint of the handheld communication device 100b. In another example, the cut out 60 may be formed to pass a cable or wire for connecting a device component on one side of the PCB 10b to another device component on another side of the PCB 10b as shown in FIG. 6. In FIG. 6, the PCB 10b has ground and power planes 16 and 18, and the cut out 60 is formed to couple a device component 46 mounted on one side of the PCB 10b to a device component 48 mounted on the other side of the PCB 10. For example, the device components 46 and 48 may be display assembly made on a display board and a main circuit board, and the device component 46 is coupled to the device component 48 via a flex cable that passes through the cut out 60.

In FIG. 6, one of the planes 16 and 18 may be a ground plane and the other may be a power plane. In one example, the layer immediately below the top surface layer(s) is the ground plane for minimal emission of EMI. A dielectric layer is disposed between the planes 16 and 18. It would be appreciated by one of ordinary skill in the art that the sizes and the shapes of the cut out 60, the RF absorber 54 and the power and ground planes 14 and 16 in FIGS. 4-6 may not be limited to those shown in the drawings and may vary.

Figure 7:
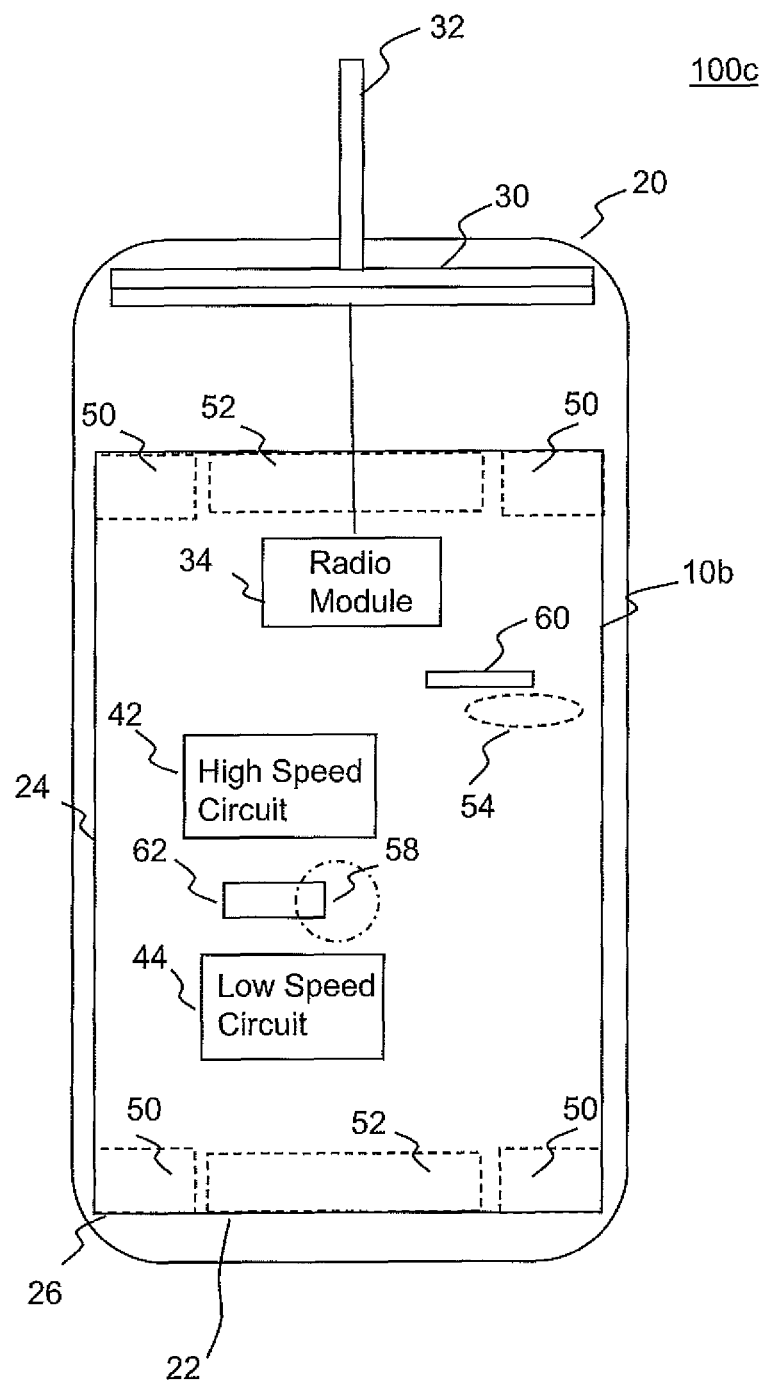
FIG. 7 is a schematic diagram illustrating a further example of a handheld communication device with RF absorbers.

Referring to FIG. 7, a further example of a handheld communication device 100c having a PCB assembly is described. In the drawings, the handheld communication device 100c and the PCB assembly with a PCB 10b is illustrated schematically. The size and the shape of components of the handheld communication device 100c may not be limited to those shown in the drawings and may vary. The handheld communication device 100c may contain more than one circuit board, and may contain other components not shown in the drawings. The handheld communication device 100c may include the PCB 10a shown in FIGS. 2-3.

The handheld communication device 100c has a grounded metal bracket 62 that is provided for enclosing or mechanically fixing a device component on the PCB 10b such that the device component is less susceptible to electrostatic discharge (ESD). For example, the metal bracket 62 may be used to secure a laser barcode scanner on the top surface of the PCB 10b, and the metal bracket may be electrically coupling to the PCB ground plane of the PCB 10b. The metal bracket 62 may be used to attach the PCB assembly to the housing 20 of the handheld communication device. The PCB surface area on which the grounded metal bracket 62 is attached or a part of the PCB ground plane to which the metal bracket 62 is coupled is identified as an emission point, and therefore RF absorber 58 is placed over or close to a part of the grounded metal bracket 62 or a top surface area of the PCB 10b close to the metal bracket 62, to attenuate EMI.

Figure 8:
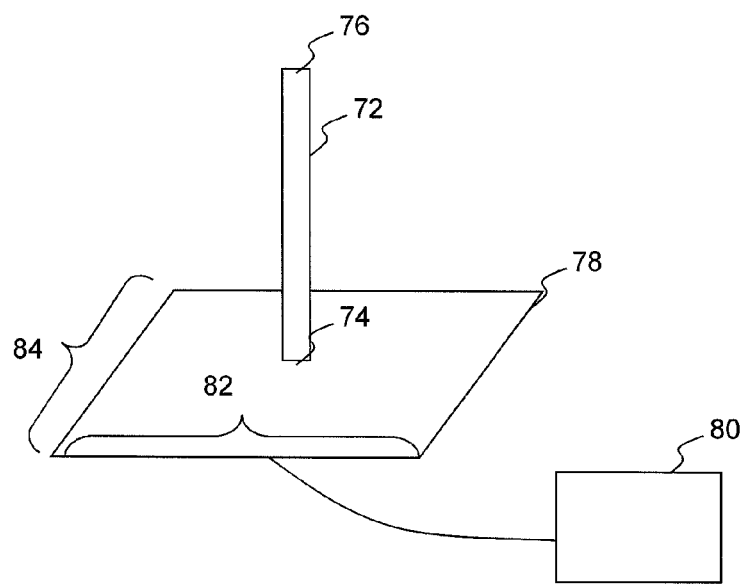
FIG. 8 is a schematic diagram illustrating an example of a radio system for the handheld communication devices of FIGS. 2, 4 and 7.

Referring to FIG. 8, there is illustrated an example of an antenna system applied to the handheld communication devices 100a-100c of FIGS. 2, 4, and 7. The antenna system 70 of FIG. 8 includes an antenna 72 extending between a first end 74 and a second end 76, a dedicated ground plane 78, and a radio module 80. The ground plane 78 has a width 82 and a length 84. The ground plane 78 has a planar surface. The first end 74 of the antenna 72 is attached to the planer surface of the ground plane 78 so that the antenna 72 extends generally perpendicular relative to the planar surface. The antenna ground plane 78 is installed onto the handheld communication device. The antenna system is attached to the PCB (e.g., 10a of FIG. 2, 10b) through a lead or a separable cable.

The antenna 72 is a helical whip antenna that may have a length between 3 to 4 inches long to cover sub-bands between 400-512 MHz. Radiation pattern may be designed to resemble that of donut, i.e., omni-directional pattern around the whip, thereby reducing some noise picked up along the axis of the antenna (tip or bottom).

The ground plane 78 may have the length 84 of about 4 inches and the width 86 of 2 inches. The ground plane 30 may be one-half or one quarter of lambda long so that the antenna receives or transmits a wavelength of lambda or less. The ground plane 78 may have cut outs and bend to allow it to fit inside the housing of the handheld communication device. The primary ground plane 78 may be too small to provide effective counterpoise for the antenna, and therefore the antenna may utilize the large ground plane on the PCB (e.g., 10a of FIG. 2, 10b) as part of its counterpoise as well.

Figure 9:
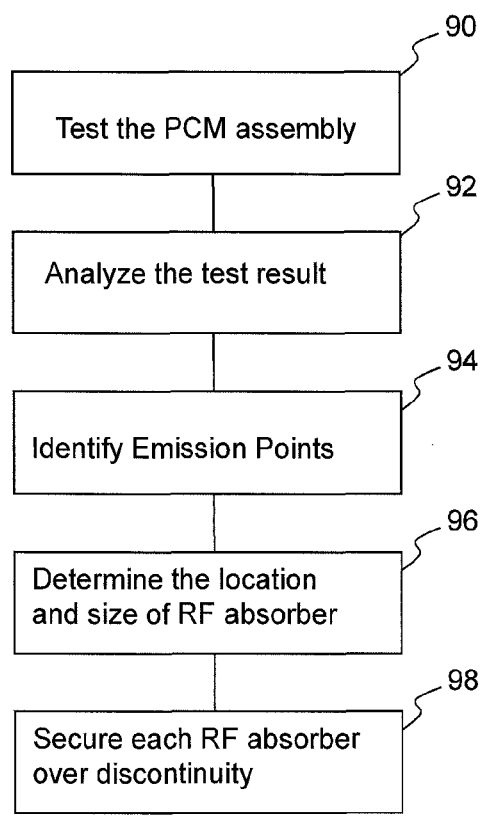
FIG. 9 is a flow chart illustrating a process of allocating RF absorbers for inhibiting EMI from emission points.
Figure 10:
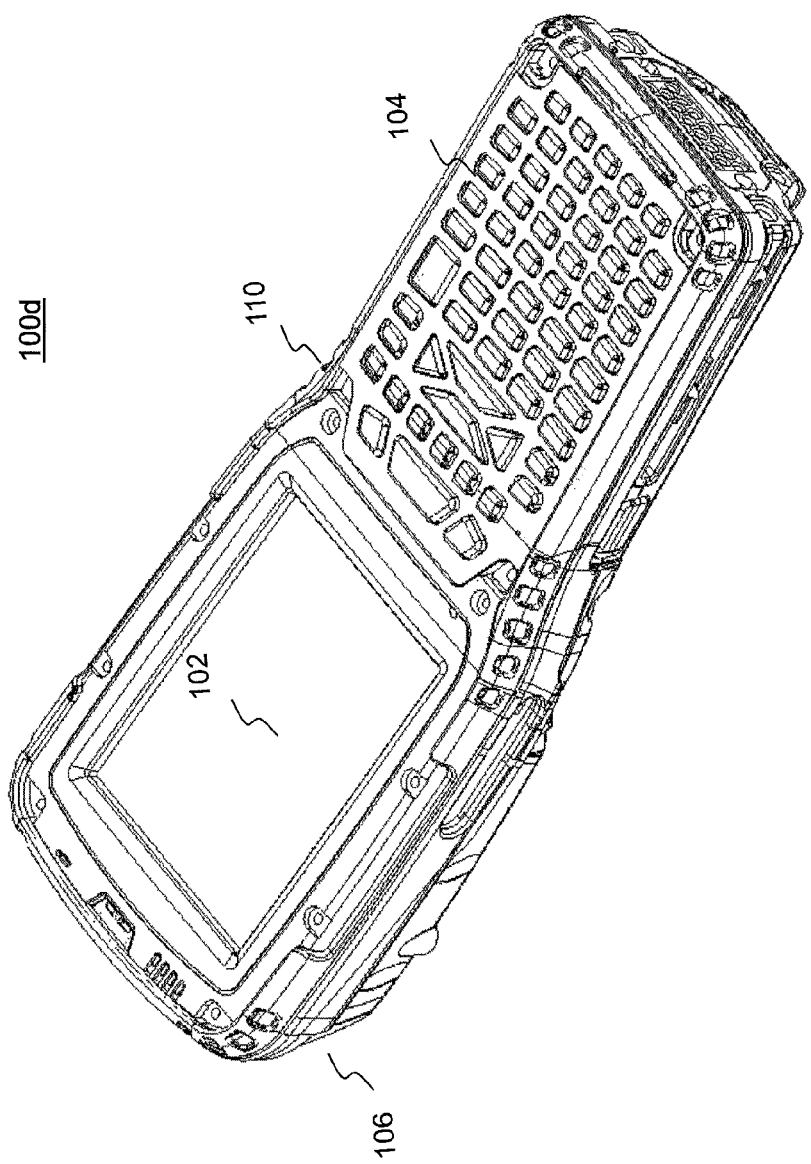
FIG. 10 is a perspective view of an example of a handheld communication device to which RF absorbers are allocated.
Figure 11:
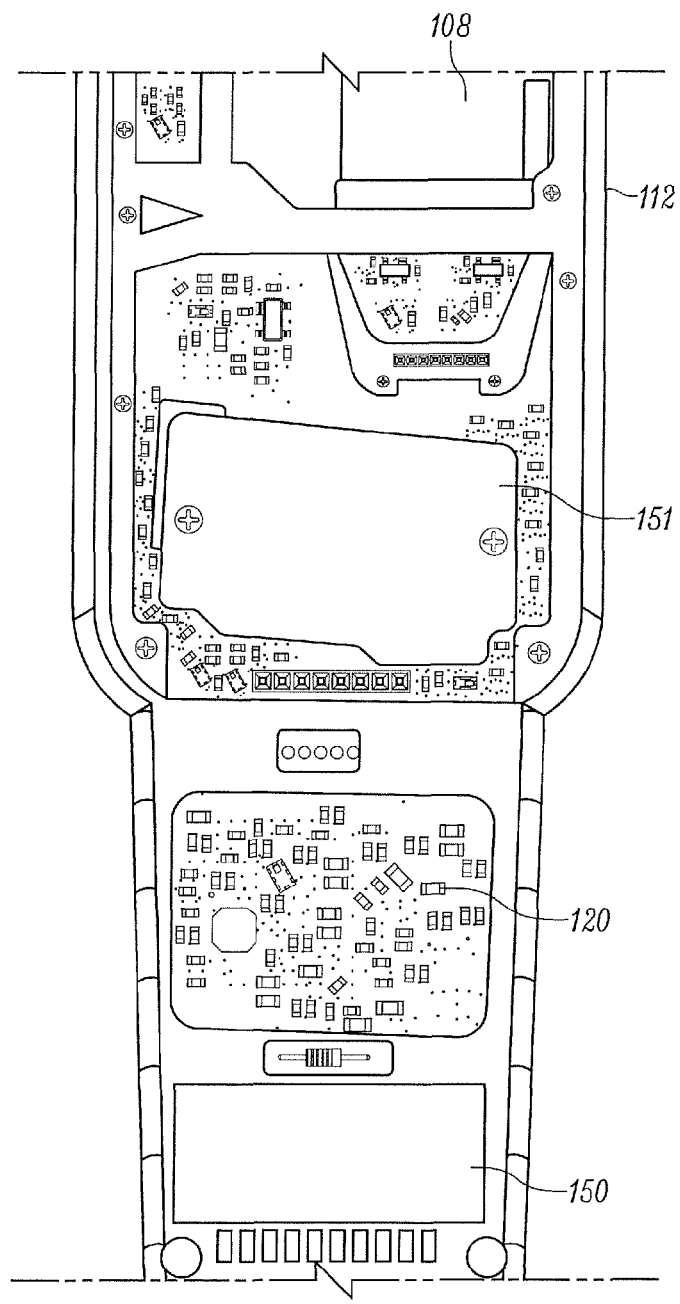
FIG. 11 is a bottom view of a main logic board with RF absorbers in the handheld communication device of FIG. 10.
Figure 12:
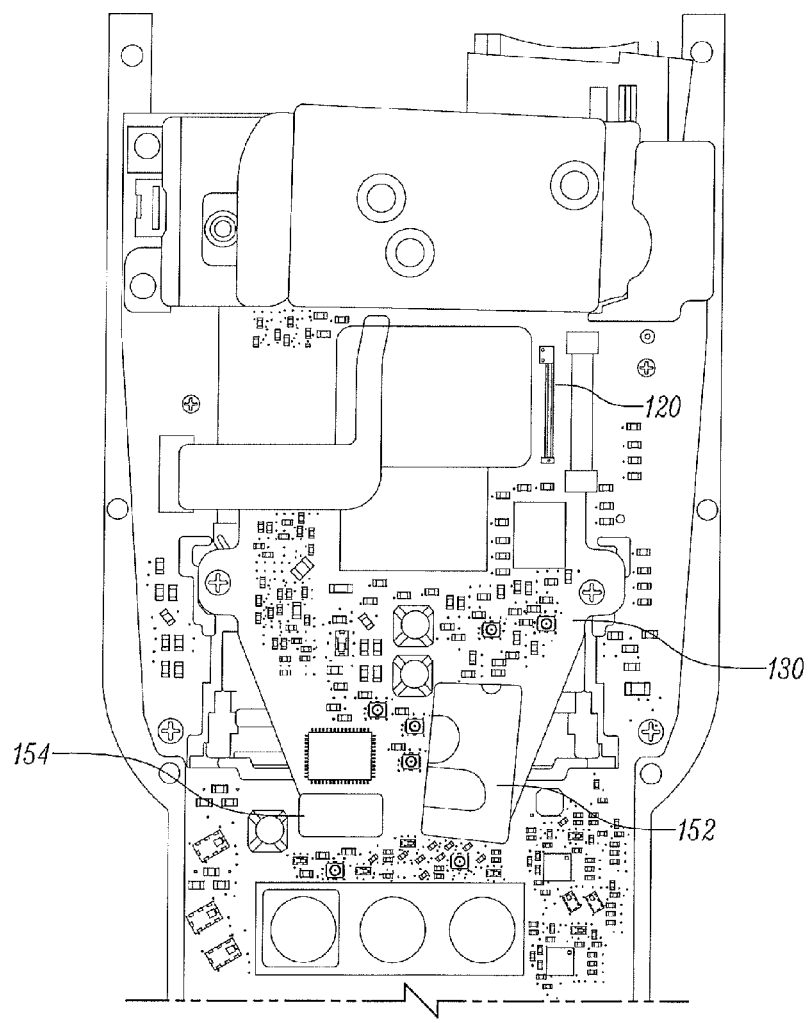
FIG. 12 is a bottom view of a daughter board with RF absorbers in the handheld communication device of FIG. 10.
Figure 13:
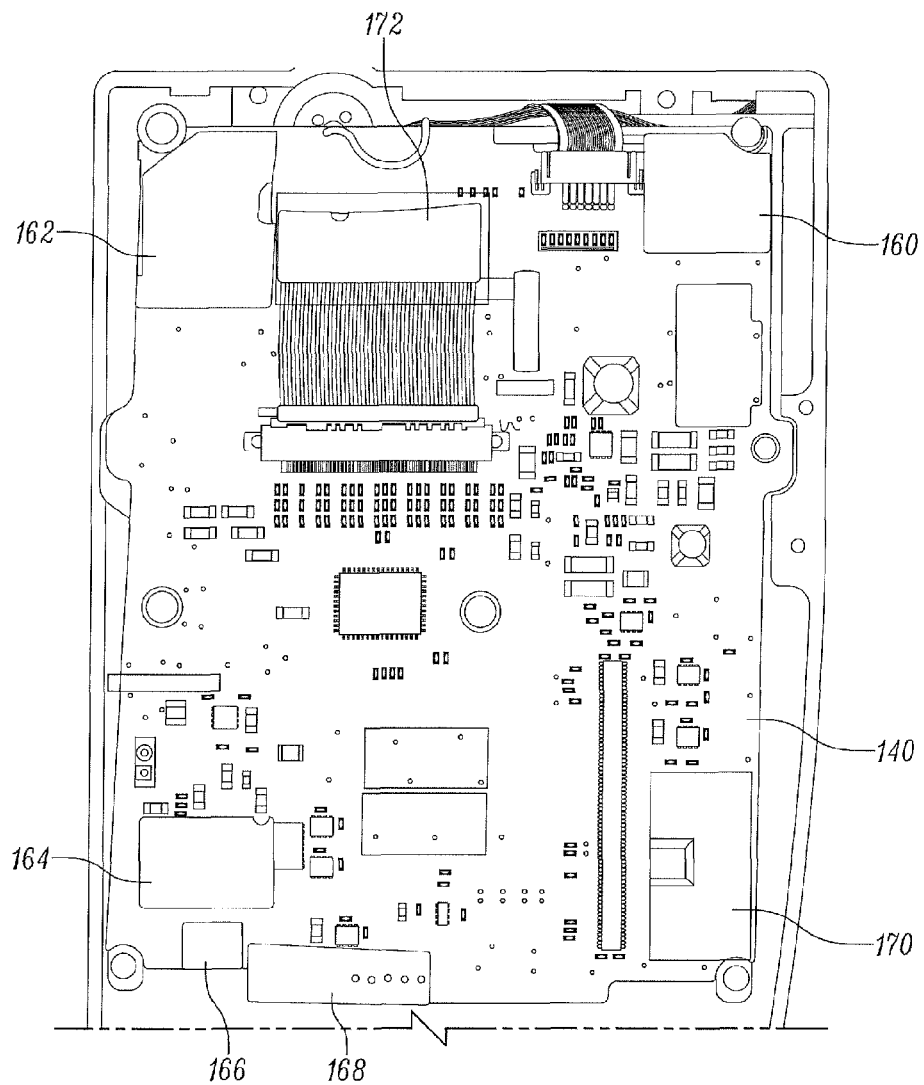
FIG. 13 is a top view of a display board with RF absorbers in the handheld communication device of FIG. 10.
Figure 14:
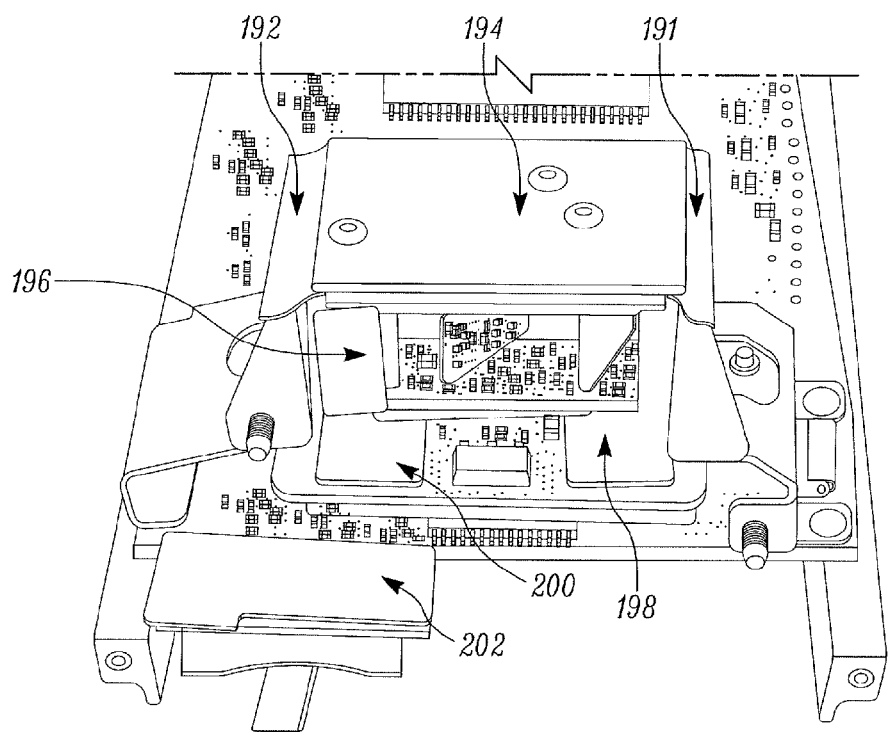
FIG. 14 is a perspective view of a scanner with RF absorbers in the handheld communication device of FIG. 10.

Referring to FIG. 9, there is illustrated an example of a process of allocating RF absorbers in a PCB assembly to suppress EMI in a handheld communication device. The PCB assembly is tested (at step 90) by scanning the PCB assembly. A close-coupling scan may be conducted with a near-field probe. The scan result is analyzed (step 92). Emission points are identified (step 94). The location and the size of the RF absorber for each emission point is determined (step 96). A suitable RF absorber may be selected from a plurality of possible RF absorber plates. The RF absorber is secured by adhesive over a localized region (e.g., edges, corners, cut outs of the PCB), associating with the emission point (step 98).

Referring to FIGS. 10-14, a handheld communication device 100d is described in detail. The handheld communication device 100d is a rugged handheld device having device components, such as a display 102, a keyboard 104, a scanner 106, a main logic board 120 having main board electronics, and a daughter circuit board 130 having daughter board electronics and coupling to the main logic board 120. The display 102 includes a display board 140. The handheld communication device 100d includes a housing 110. The housing 110 forms spaces for receiving components of the handheld communication device 100d, e.g., the main logic board 120, the display 102, the keyboard 104, and the scanner 106. The housing 110 allows for individual components of the handheld communication device to be replaced in the field, while maintaining the Ingress Penetration requirement. The handheld communication device 100d may include device components other than those shown in the drawings. For example, the handheld device 100d may include a battery component, expansion boards, auxiliary components, and/or other docking connectors.

For clarity and without loss of generality, the top of the handheld communication device 100d is generally referred to as the surface of the handheld communication device 100d having the display 102 and the keyboard 104 while the bottom of the handheld communication device 100d is the surface opposite the top.

The main logic board 120 includes the electronics for operating the handheld communication device 100d. It includes, for example, a processor and a memory. The display 102, the keyboard 104, the scanner 106, and the daughter board 130 are electrically coupled to the main logic board 120. The main logic board 120 can be electrically coupled to other components. Cables can lead from the main logic board 120 to the device components e.g., the display 102, the keyboard 104, the scanner 106, and the daughter board 130. The main logic board 120 may also be electrically connected to the battery for powering the main logic board and the attached components.

An RF absorber 150 is attached along the shorter edge of the bottom side of the main logic board 120. Another RF absorber 151 is applied on top of an active component that emits EMI (e.g., processor, memory). Here RF absorber 151 represents the conventional method of treating EMI by applying RF absorber directly over the source of the noise—which can be identified by visual analysis alone. (See FIG. 11). An RF absorber 152 and 154 are attached along the shorter edge of the top side of the daughter board 130 (See FIG. 12). RF absorbers 160-170 are attached at corners of the top surface of the display board 140 and along the shorter edge of the top surface of the display board 140 (See FIG. 13). There is a slot in the display board through which a flex cable for the display goes. An RF absorber 172 is placed next to the slot opening (See FIG. 13).

A metal bracket 190 is attached on the main logic board 120 for the scanner. This metal bracket 190 is grounded and acts as an antenna. RF absorbers 191, 192, 194, and 196 are installed on the scanner metal bracket 190 (See FIG. 14). RF absorbers 198 and 200 are installed on the daughter board. RF absorber 202 is installed on the MLB underneath a Secure Digital Input/Output (SDIO) card.

According to the embodiments of the present invention, self interference in a handheld communication device having an antenna system is significantly reduced. Also this technique can be used to fix general EMI problem. This technique minimizes the amount of RF absorber material required to achieve the same effect, comparing to a cover for blanketing the entire terminal.

What is claimed is:

1. A method of reducing self-interference in a handheld communication device with a radio system, comprising:
    testing a printed circuit board (PCB) assembly having a PCB and device components mounted on the PCB for operation of the handheld communication device, the device components switching states or oscillating in the operation of the handheld communication device, wherein testing includes testing whether one of the device components is a noise source generating frequency components resonant with a structure or material of the PCB;
    analyzing a result of the testing;
    identifying an emission point different from the noise source in the PCB from the testing, the emission point being a discontinuity of the structure or material of the PCB; and
    allocating a radio frequency (RF) absorber over or close to the emission point identified from the result to inhibit electromagnetic interference (EMI) caused by the emission point.

2. A method according to claim 1, wherein the emission point is a discontinuity of a structure or material of the PCB where surface current converts to EM noise.

3. A method according to claim 2, wherein the emission point is a discontinuity of a structure or material of a ground plane formed as part of the PCB.

4. A method according to claim 1, wherein the emission point is a cut out extending through the PCB, and wherein the RF absorber is allocated on a surface of the PCB close to the cut out.

5. A method according to claim 1, wherein the allocating further comprises:
    determining the size of the RF absorber and the position of the RF absorber.

6. A method according to claim 1, wherein the allocating further comprises:
    securing the RF absorber over a localized region on the top surface of the PCB, associated with the emission point.

7. A method according to claim 6, wherein the RF absorber for suppressing EMI from the emission point does not overlap the device component or an EMI shield.

8. A method according to claim 6, wherein the allocating further comprises:
    securing a planar plate of the RF absorber without bending, fitting around the side of the PCB.

9. A system for a handheld communication device, comprising:
    a printed circuit board (PCB) assembly having a PCB and device components mounted on the PCB for operation of the handheld communication device, the device components switching states or oscillating in the operation of the handheld communication device, the PCB having a discontinuity of a structure or material, the discontinuity of the structure or material of the PCB being identified during testing and analyzing of the PCB as a potential source of electromagnetic interference (EMI), wherein testing includes testing whether one of the device components is a noise source generating frequency components resonant with a structure or material of the PCB and analyzing includes identifying an interference emission point different from the noise source in the PCB from the testing; and
    a radio frequency (RF) absorber configured to inhibit the EMI from the emission point, and secured to a surface of the PCB, over or close to the emission point identified from the testing and analyzing, for reducing the EMI from the emission point.

10. A system according to claim 9, wherein the emission point is a cut out extending through the PCB, and wherein the RF absorber is allocated on a surface of the PCB close to the cut out.

11. A system according to claim 9, wherein a planar plate of the RF absorber is placed over or close to the discontinuity of the structure or material of the PCB without bending fitting around the side of the PCB.

12. A system according to claim 9, wherein the RF absorber for suppressing EMI from the emission point does not overlap the device component or an EMI shield.

13. A system according to claim 9, further comprising a grounded metal bracket mounted on the PCB, for enclosing an active device component mounted on the PCB, and wherein the RF absorber is applied on a top surface area of the PCB close to the metal bracket.

14. A system according to claim 9, wherein the material of the RF absorber includes at least one of at least one of ferrite, carbon, carbon fiber, alumina, sapphire, silica, titanium dioxide, iron, iron silicide and graphite.

15. A handheld communication device, comprising:
a radio system,
a printed circuit board (PCB) assembly having a PCB and device components mounted on the PCB for operation of the handheld communication device, the device components switching states or oscillating in the operation of the handheld communication device, the PCB being operatively coupling to the radio system when the PCB assembly and the radio system are installed in the handheld communication device, the PCB having a discontinuity of a structure or material, the discontinuity of the structure or material of the PCB being identified during testing and analyzing of the PCB as a potential source of electromagnetic interference (EMI), wherein testing includes testing whether one of the device components is a noise source generating frequency components resonant with a structure or material of the PCB and analyzing includes identifying an interference emission point different from the noise source in the PCB from the testing; and
a radio frequency (RF) absorber configured to inhibit the EMI from the emission point, and secured to a surface of the PCB, over or close to the emission point identified from the testing and analyzing, for reducing the EMI from the emission point.

16. A system according to claim 15, wherein the emission point is a cut out extending through the PCB, and wherein the RF absorber is allocated on a surface of the PCB close to the cut out.

17. A system according to claim 15, wherein the RF absorber for suppressing EMI from the emission point does not overlap the device component or an EMI shield.

18. A system according to claim 15, further comprising a grounded metal bracket mounted on the PCB, for enclosing an active device component mounted on the PCB, and wherein the RF absorber is applied on a top surface area of the PCB close to the metal bracket.

19. A system according to claim 15, wherein the material of the RF absorber includes at least one of at least one of ferrite, carbon, carbon fiber, alumina, sapphire, silica, titanium dioxide, iron, iron silicide and graphite.

* * * * *